(12) United States Patent
Thorne

(10) Patent No.: US 11,328,977 B2
(45) Date of Patent: May 10, 2022

(54) FLIP CHIP ASSEMBLY

(71) Applicant: Cobham Advanced Electronic Solutions, Inc., Lansdale, PA (US)

(72) Inventor: Sean Leighton Thorne, Colorado Springs, CO (US)

(73) Assignee: COBHAM COLORADO SPRINGS INC., Colorado Springs, CO (US)

( * ) Notice: Subject to any disclaimer, the term of this patent is extended or adjusted under 35 U.S.C. 154(b) by 37 days.

(21) Appl. No.: 16/438,343

(22) Filed: Jun. 11, 2019

(65) Prior Publication Data

US 2020/0395265 A1 Dec. 17, 2020

(51) Int. Cl.

| H01L 23/367 | (2006.01) |
|---|---|
| H01L 23/13 | (2006.01) |
| H01L 23/40 | (2006.01) |
| H01L 23/04 | (2006.01) |
| H01L 23/10 | (2006.01) |
| H01L 21/52 | (2006.01) |
| H01L 23/00 | (2006.01) |

(52) U.S. Cl.
CPC .......... *H01L 23/3675* (2013.01); *H01L 21/52* (2013.01); *H01L 23/04* (2013.01); *H01L 23/10* (2013.01); *H01L 23/13* (2013.01); *H01L 23/40* (2013.01); *H01L 24/16* (2013.01); *H01L 24/72* (2013.01); *H01L 24/90* (2013.01); *H01L 2224/16227* (2013.01)

(58) Field of Classification Search
CPC ..... H01L 23/13; H01L 23/3675; H01L 23/40; H01L 23/4006; H01L 23/4093; H01L 23/42; H01L 21/52; H01L 21/60285; H01L 2023/4043; H01L 2023/4062; H01L 2023/4068; H01L 2023/4075–4087; H01L 24/72; H01L 2224/81138–81141; H01L 23/04; H01L 24/90
See application file for complete search history.

(56) References Cited

U.S. PATENT DOCUMENTS

| 4,914,551 A | * | 4/1990 | Anschel | ............... H01L 23/3675 |
|---|---|---|---|---|
| | | | | 257/713 |
| 6,586,845 B1 | * | 7/2003 | Higashi | .................. H01L 24/97 |
| | | | | 257/784 |

(Continued)

*Primary Examiner* — Aaron J Gray
(74) *Attorney, Agent, or Firm* — Morgan, Lewis & Bockius LLP

(57) ABSTRACT

This application is directed to a semiconductor system including a substrate, an electronic device, a plurality of compliant interconnects and a support structure. The substrate has a first surface and a plurality of first contacts formed on the first surface. The electronic device has a second surface facing the first surface of the substrate, and a plurality of second contacts formed on the second surface. The compliant interconnects are disposed between the first surface of the substrate and the second surface of the electronic device, and are configured to electrically couple the first contacts on the first surface of the substrate to the second contacts on the second surface of the electronic device. The support structure is coupled to the substrate and the electronic device, and extends beyond a footprint of the electronic device. The support structure is configured to mechanically couple the electronic device to the substrate.

16 Claims, 10 Drawing Sheets

(56) References Cited

U.S. PATENT DOCUMENTS

| | | | | |
|---|---|---|---|---|
| 2002/0065965 A1* | 5/2002 | Sathe | ............... | H01L 23/055 |
| | | | | 710/100 |
| 2003/0062541 A1* | 4/2003 | Warner | ............... | G06F 21/10 |
| | | | | 257/200 |
| 2005/0142900 A1* | 6/2005 | Boggs | ............... | H01R 13/2478 |
| | | | | 439/66 |
| 2005/0287828 A1* | 12/2005 | Stone | ............... | H05K 7/1069 |
| | | | | 439/66 |
| 2006/0158857 A1* | 7/2006 | Luckner | ............... | H01L 23/4093 |
| | | | | 361/719 |
| 2013/0154678 A1* | 6/2013 | Nelson | ............... | G01R 1/06738 |
| | | | | 324/750.24 |
| 2013/0280929 A1* | 10/2013 | Warwick | ............... | H01R 13/03 |
| | | | | 439/86 |

* cited by examiner

600

602
A substrate comprising a first surface and a plurality of first contacts formed on the first surface

610
The substrate includes one or more first fastener structures that are configured to align and mate with one or more second fastener structures of the support structure, and when mated, the first and second fastener structures hold the support structure onto the substrate

612
The plurality of second contacts and the plurality of first contacts are configured to self-aligned when the first and second fastener structures are mated to each other

614
the support structure is detachable from the substrate

616
The substrate comprise a printed circuit board (PCB)

618
The first surface of the substrate is planar (A)

608 (Continued)
A support structure coupled to the substrate and the electronic device, wherein the support structure extends beyond the footprint of the electronic device, and wherein the support structure is configured to mechanically couple the electronic device to the substrate

---

634
The support structure is detachable from the electronic device.

---

636
The support structure is coupled to the substrate via an adhesive

---

638
The support structure comprises a third fastener structure configured to couple to a fourth fastener structure of the electronic device, and when mated, the third and fourth fastener structures couple the electronic device onto the support structure

---

640
The support structure is coupled to the electronic device via an adhesive

---

642
The support structure is coupled to the substrate via one of direct bonding, eutectic bonding, anodic bonding and glass soldering

---

644
Any one of the support structure, the electronic device and the substrate is made of silicon or glass

646
A material of the support structure is distinct from a material of the substrate

Figure 6D

FLIP CHIP ASSEMBLY

TECHNICAL FIELD

The disclosed embodiments relate generally to electronic packaging technology, and in particular to, methods and systems of arranging two semiconductor substrates in a flip chip configuration and electrically coupling them using compliant interconnects.

BACKGROUND

An electronic die can be directly attached to a substrate using solder bumps in flip chip packaging to provide a substantially high interconnect density. This flip chip packaging technology has been widely used in many applications ranging from consumer products to highly sophisticated system in package (SIP) designs, Application Specific Integrated Circuits (ASICs), radio frequency (RF) chipsets, PC chipsets, graphics, and memory packages. In addition to solder bumps, stud bumps, solder pastes, copper pillars or other local fixtures are used to in the flip chip packaging technology to couple the electronic die to the substrate electrically and mechanically. An additional potting or adhesive material can also be applied to fully or partially fill a space separating the electronic die and the substrate. However, the local fixtures and additional adhesive material are susceptible to and may be disrupted by mechanical stress caused by a thermal mismatch between the electronic die and substrate. In high frequency RF applications, use of the additional adhesive material may also compromise electrical performance of the RF integrated circuit formed on the electronic die or substrate. Thus, there is a need to couple an electronic die to a substrate in a secure manner while providing reliable electrical performance under different conditions.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to reduce mechanical stress that causes interconnect failures in a flip chip semiconductor package and minimize detrimental factors that compromise electrical performance of any integrated circuits therein. Specifically, in an example, compliant interconnects are applied to replace flip chip interconnects made of copper pillars or solder bumps. The compliant interconnects form a reliable electrical interface while maintaining rigidity and mechanical robustness. Additionally, an external body (e.g., support structure) is applied outside a footprint of a corresponding semiconductor die to secure the semiconductor die to a substrate in the flip chip semiconductor package, thereby avoiding use of potting or adhesive material between the semiconductor and die and protecting performance of integrated circuits in the package from being compromised.

(A1) According to some embodiments, there is provided a semiconductor system. The semiconductor system has a substrate including a first surface and a plurality of first contacts formed on the first surface. The semiconductor system further includes an electronic device including a second surface, and a plurality of second contacts formed on the second surface. The electronic device has a predetermined second surface, and has a footprint on the second surface. The second surface of the electronic device faces the first surface of the substrate. A plurality of compliant interconnects are disposed between the first surface of the substrate and the second surface of the electronic device. The plurality of compliant interconnects are configured to electrically couple the plurality of first contacts on the first surface of the substrate to the plurality of second contacts on the second surface of the electronic device. The semiconductor system further includes a support structure coupled to the substrate and the electronic device. The support structure extends beyond the footprint of the electronic device, and is configured to mechanically couple the electronic device to the substrate.

(A2) In some embodiments of the semiconductor system of (A1), the electronic device is mechanically coupled to the substrate by the support structure and the plurality of compliant interconnects are deformed (in a direction perpendicular to the first and second surfaces) to electrically couple with the plurality of first contacts and/or the plurality of second contacts. In some embodiments, each of the plurality of compliant interconnects is electrically coupled to a respective one of the first contacts and second contacts when a corresponding contact area between the respective compliant interconnect and the respective one of the first contacts and second contacts exceeds a threshold contact area (e.g., 80%-120% of an area of the respective first or second contact). In some embodiments, each of the plurality of compliant interconnects is electrically coupled to a respective one of the first contacts and second contacts when the respective compliant interconnect is physically compressed by a threshold amount. In some embodiments, each of the plurality of compliant interconnects is electrically coupled to a respective one of the first contacts and second contacts when a contact resistance between the respective compliant interconnect and the respective one of the contacts is less than a threshold resistance. In some embodiments, one of the plurality of compliant interconnects is electrically coupled to both a respective one of the first contacts and a respective one of the second contacts. The one of the plurality of compliant interconnects is deformed to fill a space and form an electrical path between the respective one of the first contacts and/or the respective one of the second contacts.

(A3) In some embodiments of the semiconductor system of any of (A1) and (A2), the deformation of the plurality of compliant interconnects is not reversible. Thus, when the support structure is no longer coupled to the substrate and the electronic device is removed from the substrate, the plurality of compliant interconnects do not return their original shape (i.e., a non-deformed state).

(A4) In some embodiments of the semiconductor system of any of (A1)-(A3), the support structure is further configured to align the plurality of second contacts and the plurality of first contacts.

(A5) In some embodiments of the semiconductor system of any of (A1)-(A4), the electronic device further includes a third surface opposite to the second surface and the support structure is coupled to the third surface of the electronic device.

(A6) In some embodiments of the semiconductor system of any of (A1)-(A4), the support structure is mechanically coupled to an edge of the electronic device.

(A7) In some embodiments of the semiconductor system of any of (A1)-(A6), the support structure includes a heat sink.

(A8) In some embodiments of the semiconductor system of any of (A1)-(A6), the support structure is further coupled to a heat sink.

(A9) In some embodiments of the semiconductor system of any of (A1)-(A8), the electronic device is a semiconductor die or a semiconductor device package.

(A10) In some embodiments of the semiconductor system of any of (A1)-(A9), the support structure defines a recess. The support structure has a depth of the recess equal to or less than a sum of a thickness of the electronic device and a compressed height of the plurality of compliant interconnects. When the support structure mechanically couples the electronic device to the substrate, the plurality of second contacts of the electronic device make contact with the plurality of first contacts of the substrate via the plurality of compliant interconnects. The depth of the recess takes into account the contact height of the plurality of second contacts of the electronic device and the contact height of the plurality of first contacts of the substrate, such that when the support structure is coupled to the substrate the plurality of first contacts and/or the plurality of second contacts are electrically coupled, via the plurality of compliant interconnects.

(A11) In some embodiments of the semiconductor system of any of (A1)-(A10), the support structure forms an enclosure when coupled to the substrate, and the formed enclosure encloses the electronic device.

(A12) In some embodiments of the semiconductor system of (A11), the enclosure is a vacuum (i.e., an interior of the enclosure has an air pressure level lower than a predetermined vacuum level).

(A13) In some embodiments of the semiconductor system of (A11), the pressure within the enclosure is less than a predetermined pressure.

(A14) In some embodiments of the semiconductor system of (A11), the enclosure is not ambient pressure.

(A15) In some embodiments of the semiconductor system of (A11), the enclosure is not a vacuum.

(A16) In some embodiments of the semiconductor system of any of (A1)-(A15), the support structure is grounded to provide electromagnetic (EM) shielding. The EM shielding reduces the electromagnetic fields in the enclosure by isolating the electrical device from surroundings that may impact performance.

(A17) In some embodiments of the semiconductor system of any of (A1)-(A16), the support structure is detachable from the electronic device.

(A18) In some embodiments of the semiconductor system of any of (A1)-(A17), the support structure makes contact (i.e. merely touching) with at least one surface of the electronic device.

(A19) In some embodiments of the semiconductor system of (A18), the support structure makes contact (i.e. merely touches) with the third surface of the electronic device such that, when the support structure is removed, the electronic device is detached from the support structure.

(A20) In some embodiments of the semiconductor system of any of (A1)-(A19), the substrate includes one or more first fastener structures and the support structure includes one or more second fastener structures. The one or more first fastener structures of the substrate are configured to align and mate with the one or more second fastener structures of the support structure. The first and second fasteners, when mated, hold the support structure onto the substrate.

(A21) In some embodiments of the semiconductor system of (A20), the one or more first fastener structures are selected from a group consisting of: a cavity, frame, mount, surface of the substrate, clasp, clamp, clip, locking mechanism, latch, nuts, washers, fixtures, pins, hooks, anchors, screws, bolts, and other types of similar structures.

(A22) In some embodiments of the semiconductor system of any of (A20) and (A21), the one or more second fastener structures selected from a group consisting of: a cavity, frame, mount, clasp, clamp, clip, locking mechanism, latch, nuts, washers, fixtures, pins, hooks, anchors, screws, a portion of surface of the support structure, bolts, and other types of similar structures.

(A23) In some embodiments of the semiconductor system of (A20), the one or more first fastener structures includes a cavity (e.g. a hole), the cavity extending a predetermined distance into the substrate, and the one or more second fastener structures includes an extended pin that fits tightly (a friction fit) and/or is snapped into the cavity. The one or more second fastener structures configured to couple the support structure onto the substrate.

(A24) In some embodiments of the semiconductor system of (A23), the predetermined distance of the cavity, is the thickness of the substrate (e.g. a through hole, or drilled cavity).

(A25) In some embodiments of the semiconductor system of any of (A23) and (A24), the one or more second fasteners are configured to pierce and/or penetrate the one or more first fastener structures.

(A26) In some embodiments of the semiconductor system of (A25), when the one or more second fastener structures pierce and/or penetrate the one or more first fastener structures, the one or more first fastener structures are enlarged such that the one or more second fastener structures and the one or more first fastener structures are secured to each other.

(A27) In some embodiments of the semiconductor system of any of (A23)-(A26), the one or more second fastener structures couple to the substrate via a fourth surface of the substrate, the fourth surface of the substrate being opposite to the first surface.

(A28) In some embodiments of the semiconductor system of any of (A20)-(A27), the plurality of second contacts and the plurality of first contacts are configured to be self-aligned to each other when the first and second fastener structures are mated to each other.

(A29) In some embodiments of the semiconductor system of any of (A20)-(A28), the one or more second fastener structures can be decoupled from the one or more first fastener structures of the substrate (e.g., without damaging the first or second fastener structures).

(A30) In some embodiments of the semiconductor system of any of (A1)-(A19), the support structure is configured to pierce and/or penetrate the substrate by a predetermined distance.

(A31) In some embodiments of the semiconductor system of (A30), when the support structure pierces and/or penetrates the substrate by the predetermined distance into the substrate, the support structure mates, hooks, and/or snaps to the substrate.

(A32) In some embodiments of the semiconductor system of any of (A30) and (A31), the support structure couple to the substrate via a fourth surface of the substrate, the fourth surface of the substrate being opposite to the first surface.

(A33) In some embodiments of the semiconductor system of any of (A30)-(A32), the plurality of second contacts and the plurality of first contacts are configured to be self-aligned to each other when the support structure pierces and/or penetrates the substrate.

(A34) In some embodiments of the semiconductor system of any of (A30)-(A33), the support structure can be decoupled from the substrate.

(A35) In some embodiments of the semiconductor system of any of (A1)-(A34), the support structure is detachable from the substrate.

(A36) In some embodiments of the semiconductor system of any of (A1)-(A35), the support structure is coupled to the substrate via potting material or adhesive (e.g., on an edge area where the electronic device is not coupled).

(A37) In some embodiments of the semiconductor system of any of (A1)-(A36), the support structure includes a third fastener structure configured to couple to a fourth fastener structure of the electronic device. The third and fourth fasteners, when mated, couple the electronic device onto the support structure.

(A38) In some embodiments of the semiconductor system of (A37), the one or more third fastener structures are selected from a group consisting of: a cavity, frame, mount, clasp, clamp, clip, locking mechanism, latch, nuts, washers, fixtures, pins, hooks, anchors, screws, a portion of surface of the support structure, bolts, and other type of similar structures.

(A39) In some embodiments of the semiconductor system of any of (A37) and (A38), the one or more fourth fastener structures include of the third surface of the electronic device, a cavity, frame, mount, clasp, clamp, clip, locking mechanism, latch, nuts, washers, fixtures, pins, hooks, anchors, screws, bolts, or other type of similar structures.

(A40) In some embodiments of the semiconductor system of (A37), the one or more fourth fastener structures include a surface and/or the edge of the electronic device.

(A41) In some embodiments of the semiconductor system of any of (A37) and (A40), the third fastener structures include a frame, mount, and/or cavity (e.g. hole), the frame, mount, and/or cavity configured to couple with the fourth fastener structures.

(A42) In some embodiments of the semiconductor system of any of (A1)-(A41), the support structure is coupled to the electronic device via a potting material or adhesive (e.g. epoxy).

(A43) In some embodiments of the semiconductor system of (A42), the adhesive is thermally conductive.

(A44) In some embodiments of the semiconductor system of any of (A42) and (A43), the adhesive include epoxy and/or thermal paste.

(A45) In some embodiments of the semiconductor system of any of (A1)-(A44), the support structure is coupled to the substrate via one of direct bonding, eutectic bonding, anodic bonding and glass soldering.

(A46) In some embodiments of the semiconductor system of any of (A1)-(A45), each one of the support structure, the electronic device and the substrate of the system is optionally made of one of glass, silicon, silicon germanium, gallium arsenide, gallium nitride and indium phosphide.

(A47) In some embodiments of the semiconductor system of any of (A1)-(A46), the support structure is included of a material that is distinct from a material of the substrate.

(A48) In some embodiments of the semiconductor system of any of (A1)-(A47), the substrate include a printed circuit board (PCB).

(A49) In some embodiments of the semiconductor system of (A48), the PCB includes semiconductor dies and/or discrete components mounted on the top surface.

(A50) In some embodiments of the semiconductor system of any of (A48) and (A49), the PCB includes one or more layers of interconnects.

(A51) In some embodiments of the semiconductor system of any of (A1)-(A50), the first surface of the substrate is planar.

(A52) In some embodiments of the semiconductor system of any of (A1)-(A51), the substrate includes through vias.

(A53) In some embodiments of the semiconductor system of any of (A1)-(A52), the bonding and/or packing mechanisms include one or more bonding or adhesive methods selected from the group consisting of direct bonding, surface activated bonding, plasma activated bonding, anodic bonding, eutectic bonding, glass frit bonding, adhesive bonding, thermal compression bonding, reactive bonding, and/or transient liquid phase diffusion bonding.

(A54) In some embodiments of the semiconductor system of any of (A1)-(A53), the plurality of first contacts rise above (e.g. sit on top) and/or extend beyond the first surface of the substrate and the plurality of second contacts rise above (e.g. sit on top) and/or extend beyond the second surface of the electronic device.

(A55) In some embodiments of the semiconductor system of any of (A1)-(A54), the electronic device is thermally annealed to improve electrical contacts and/or the formation of electrical contacts between the plurality of compliant interconnects, the plurality of first contacts, and/or the plurality of second contacts.

(A56) In some embodiments of the semiconductor system of any of (A1)-(A55), the adhesives include one or more adhesives selected from the group consisting of epoxies, silicone, elastomers, and/or sodium silicates.

(A57) In some embodiments of the semiconductor system of any of (A1)-(A56), the plurality of compliant interconnects include at least one elastomer pin.

(A58) In some embodiments of the semiconductor system of any of (A1)-(A57), the plurality of compliant interconnects are bonded to the plurality of second contacts on the second surface of the electronic device prior to being electrically coupled to the plurality of first contacts on the first surface of the substrate.

(A59) In some embodiments of the semiconductor system of any of (A10)-(A58), the recess includes an additional electronic device in addition to the electronic device, wherein the electronic device and the additional electronic device are electrically coupled to each other via the mechanical coupling of the support structure to the substrate.

(A60) In some embodiments of the semiconductor system of (A59), the electronic device and the additional electronic device are electrically coupled to each other via the plurality of compliant interconnects, the plurality of first contacts, and/or the plurality of second contacts.

(A61) In some embodiments of the semiconductor system of any of (A10)-(A60), the substrate is coupled to another electronic device that is outside the recess, wherein the electronic device in the recess is electrically coupled to the other electronic device via the mechanical coupling of the support structure to the substrate.

(A62) In some embodiments of the semiconductor system of (A61), the electronic device and the other electronic device are electrically coupled to each other via the plurality of compliant interconnects, the plurality of first contacts, and/or the plurality of second contacts.

(A63) In some embodiments of the semiconductor system of any of (A10)-(A62), the substrate includes a first integrated circuit formed on itself, wherein the first electronic device in the recess is electrically coupled to the first integrated circuit via the mechanical coupling of the support structure to the substrate.

(A64) In some embodiments of the semiconductor system of (A63), the first electronic device in the recess is electrically coupled to the first integrated circuit via the plurality of compliant interconnects, the plurality of first contacts, and/or the plurality of second contacts.

(A65) In some embodiments of the semiconductor system of any of (A10)-(A64), an interconnect is formed on the unrecessed portion of the support structure.

(A66) In some embodiments of the semiconductor system of any of (A10)-(A65), the support structure includes multiple components and the multiple components are electrically coupled to each other and/or the substrate via the plurality of compliant interconnects, the plurality of first contacts, and/or the plurality of second contacts.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 6A-6D are flow diagrams showing a method of constructing a semiconductor system including a flip chip assembly in accordance with some embodiments.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

Figure 1A:
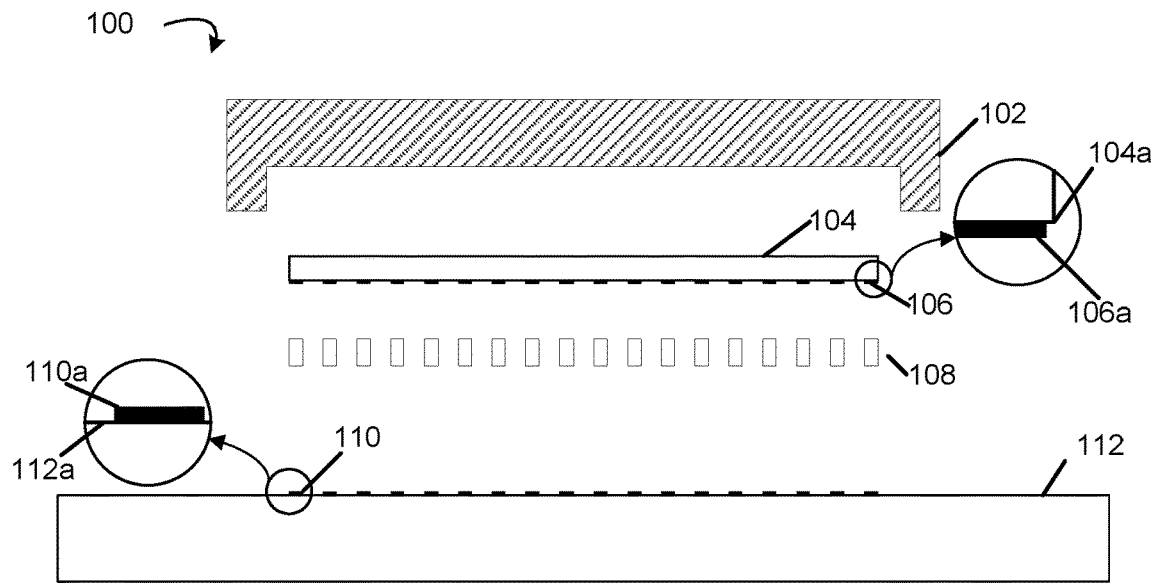
FIGS. 1A-1C illustrate a system and process of coupling an electronic device to a substrate to form a representative flip chip assembly 100 in accordance with some embodiments.
Figure 1B:
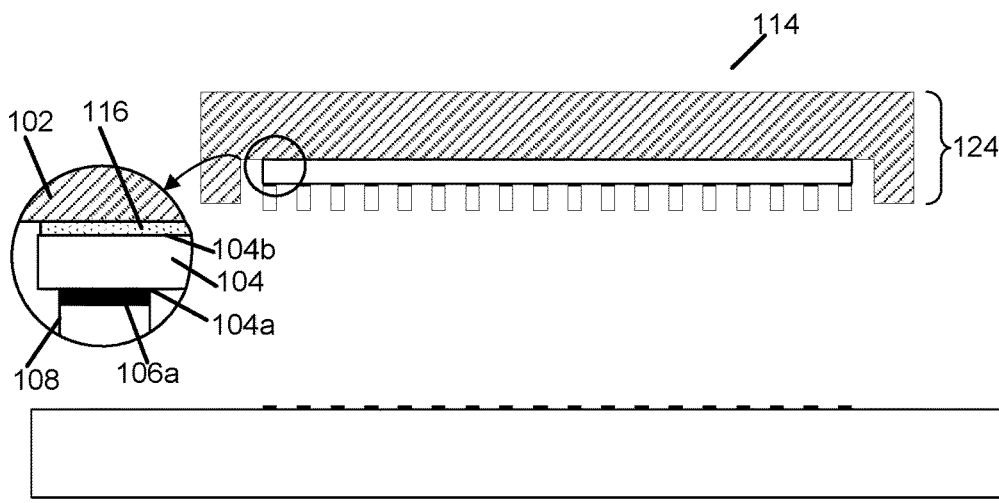
Figure 1C:
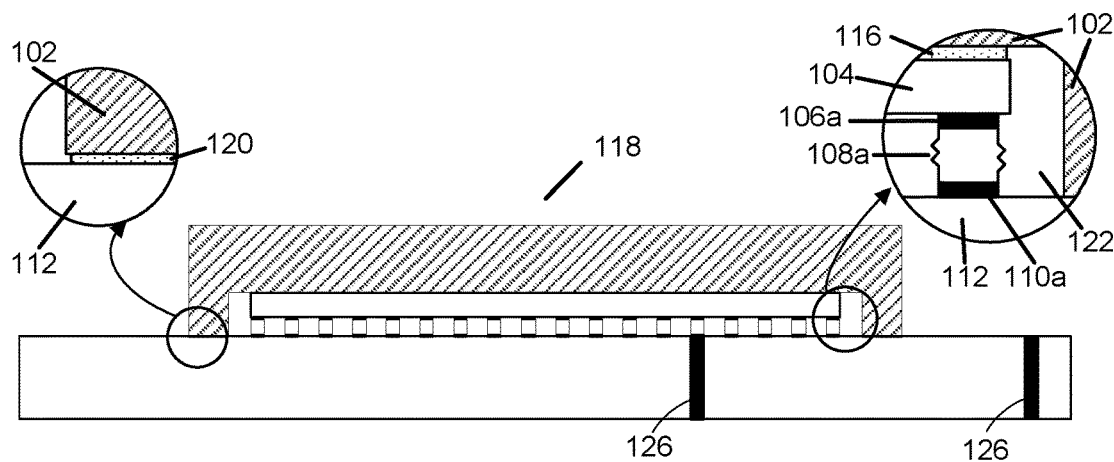

FIGS. 1A-1C illustrates a system and process of coupling an electronic device 104 to a substrate 112 to form a representative flip chip assembly 100 in accordance with some embodiments. Specifically, FIG. 1A is an expanded or exploded view of the flip chip assembly 100, and FIGS. 1B and 1C show a first coupled state 114 and a second coupled state 118 of the flip chip assembly, respectively. The flip chip assembly 100 includes a support structure 102, the electronic device 104 having a plurality of second contacts 106, a plurality of compliant interconnects 108, and a substrate 112 having a plurality of first contacts 110. In some embodiments, each of the support structure 102, electronic device 104, and substrate 112 is optionally made of one of glass, silicon, silicon germanium, gallium arsenide, gallium nitride, and indium phosphide. In some embodiments, a material of the support structure 102 is distinct from a material of the substrate 112. In some embodiments, the plurality of first contacts 110 and/or the plurality of second contacts 106 rise above (i.e. extend beyond) a first surface 112a of the substrate 112 and a second surface 104a of the electronic device 104, respectfully. For example, as seen in FIG. 1A, the first contact 110a of the plurality of first contacts 110a and/or second contact 106a of the plurality of second contacts 106, rise above (or extend beyond) the first surface 112a of the substrate 112 and the second surface 104a of the electronic device 104, respectfully.

The substrate 112 includes the first surface 112a. In some embodiments, the first surface 112a of substrate 112 is planar. The plurality of first contacts 110 is formed on the first surface of substrate 112. In an example, the plurality of first contacts 110 are formed on a layer of conductive material that is covered by a top dielectric coating layer coating the first surface 112a of the substrate 112. The first contacts 110 are accessible via openings on the tope dielectric layer. In some embodiments not shown in FIG. 1A, the substrate 112 is a printed circuit board (PCB) that further includes semiconductor dies and/or discrete components mounted on the first surface 112a, and the semiconductor dies and/or discrete components are distinct from electronic device 104. In some embodiments, the PCB includes one or more layers of interconnects. In some embodiments, the substrate 112 includes one or more through-substrate vias 126 that are optionally coupled to the first contacts 110 on the substrate 112.

The electronic device 104 includes the second surface 104a. The second surface 104a of the electronic device 104 faces the first surface 112a of the substrate 112 when the electronic device 104 and the substrate 112 are coupled in the flip chip assembly 100. The plurality of second contacts 106 is formed on the second surface 104a. In an example, the plurality of first contacts 110 are formed on a layer of conductive material that is covered by a top dielectric coating layer coating the first surface 112a of the substrate 112. The first contacts 110 are accessible via openings on the top dielectric layer. The electronic device 104 has a footprint. In some embodiments, the footprint of the electronic device includes a predetermined height, widths, and length. Optionally, the electronic device 104 is a semiconductor die. Optionally, the electronic device 104 is a semiconductor device package (e.g., a semiconductor die that is packaged in a casing).

A plurality of compliant interconnects 108 are disposed between the first surface 112a of the substrate 112 and the second surface 104a of the electronic device 104. The plurality of compliant interconnects 108 are configured to electrically couple the plurality of first contacts 110 on the first surface 112a of the substrate to the plurality of second contacts 106 on the second surface 104a of the electronic device, when the electronic device 104 and the substrate 112 are coupled in the flip chip assembly 100. In some embodiments, at least one of the plurality of compliant interconnects 108 includes an elastomer pin.

In addition to the compliant interconnects 108, the support structure 102 is also configured to be coupled to the substrate 112 and the electronic device 104. The compliant interconnects 108 are coupled between the substrate 112 and electronic device 104. In contrast, the support structure 102 extends beyond the footprint of the electronic device 104 and is configured to mechanically couple the electronic device 104 to the substrate 112 (e.g., at least partially outside the footprint of the electronic device 104). In some embodiments, the support structure 102 includes a heat sink, i.e., at least partially acts as the heat sink. In some embodiments, the support structure 102 is further coupled to a separate heat sink, and the heat sink is optionally attached to a top surface of the support structure 102 that is opposite to a recess surface on which the electronic device 104 is mounted. In some embodiments, the support structure 102 defines a recess with a predefined depth. In some embodiments, the predefined depth of the recess is equal to or less than a sum of a thickness of the electronic device 104 and a height of the plurality of compliant interconnects 108. The plurality of compliant interconnects is deformed to fit between the electronic device 104 and the substrate 112 when the support structure 102 couples the electronic device 104 to the substrate 112. That said, the sum of the thickness of the electronic device 104 and the height of the deformed compliant interconnects becomes equal to the predefined depth of the recess. The predefined depth optionally includes contact heights of the plurality of first contacts 110 and the plurality of second contacts 106. In some embodiments, the support structure 102 extends beyond the predetermined footprint of the electronic device 104, and includes a predefined depth that is greater than the sum of the thickness of the electronic device 104 and the height of the plurality of compliant interconnects 108 because part of the support structure 102 can penetrate the substrate 112. More details on a flip chip assembly in which the support structure 102 partially penetrates the substrate are discussed below with reference to FIGS. 4A-4C.

Referring to FIG. 1B, in first coupled state 114, the support structure 102 is coupled to the electronic device 104 to an intermediate assembly 124 that is further coupled to the substrate 112. The second surface 104a of the electronic device 104 faces the first surface 112a of the substrate 112, and the plurality of compliant interconnects 108 are coupled to (e.g., attached to) the plurality of second contacts 106.

In some embodiments, the electronic device 104 further includes a third surface 104b opposite to the second surface 104a, and the support structure 102 is coupled to the third surface 104b of the electronic device 104, thereby holding the electronic device 104 towards the first surface 112a of the substrate. Alternatively, in some embodiments, the support structure 102 is coupled to the electronic device 104 from an edge 404 of the electronic device 104 or via a third fastener structure 214 of the support structure 102. More details are discussed below with reference to FIGS. 2 and 4.

In some embodiments, the support structure 102 is coupled to the electronic device 104 via an adhesive 116 or via other bonding methods.

In some embodiments, the adhesive 116 is thermally conductive, and optionally includes epoxy, glue, and/or other thermal pastes. In some embodiments, the adhesive 116 includes adhesives selected from a group consisting of epoxies, silicone, elastomers, and/or sodium silicates. In some embodiments, after the plurality of compliant interconnects 108 are physically coupled to the plurality of second contacts 106, the electronic device 104 is thermally annealed to improve contact between the compliant interconnects 108 and the second contacts 106. In some embodiments, the plurality of compliant interconnects 108 are soldered/bonded to the electronic device 104. In some embodiments the plurality of compliant interconnects 108 are ultrasonically bonded to the plurality of second contacts 106 of the electronic device 104.

The support structure 102 extends beyond the footprint of the electronic device when coupled. In some embodiments, the support structure 102 is permanently bonded to the electronic device 104, and cannot be detached from the electronic device 104 without damaging the electronic device 104. In some embodiments, the support structure can be decoupled from the electronic device 104, such that the decoupled support structure 102 or electronic device 104 can be reused. In some embodiments, the support structure 102 merely touches the third surface 104b of the electronic device 104 such that, when the support structure 102 is removed, the electronic device 104 is detached from the support structure 102. In some embodiments, a subset of the plurality of compliant interconnects 108, when coupled to the electronic device via the second contacts 106, extends beyond the support structure 102, such that the subset of the plurality of compliant interconnects 108 can be tested non-destructively (without deforming the plurality of compliant interconnects.) Optionally, the subset of the plurality of compliant interconnects 108 is electrically coupled to an interconnect external to the support structure 102, such that the subset of the plurality of compliant interconnects 108 can be tested without decoupling the support structure 102 from the substrate 112.

Referring to FIG. 1C, in the second coupled state 118, the intermediate assembly 124 is further coupled to the substrate 112. The compliant interconnects 108 and the support structure 102 are configured to couple the electronic device 104 to the substrate 112. In some embodiments, when the electronic device 104 is mechanically coupled to the substrate 112 by the support structure 102, the plurality of compliant interconnects 108 are deformed to be electrically coupled with the plurality of first contacts 110 and/or the plurality of second contacts 106. For example, a compliant interconnect 108a (i.e. deformed compliant interconnect 108a) deforms to electrically couple a respective first contact 110a and a respective second contact 106a. In some embodiments, each compliant interconnect of the plurality of compliant interconnects 108 is capable/available to be compressed by a predetermined compression amount. In some embodiments, each compliant interconnect of the plurality of compliant interconnects 108 has a predetermined compression amount (e.g. up to 40%-80% of their respective height depending on the type of interconnect (e.g., an uncompressed height)). In some embodiments, the deformed compliant interconnect 108a of the plurality of compliant interconnects 108 cannot be returned to the original non-deformed shape (i.e. deformation is permanent and not reversible). For example, if the intermediate assembly 124 is decoupled from substrate 112, the plurality of compliant interconnects 108 remain in a deformed shape (e.g. 108a). In some embodiments, each of the plurality of compliant interconnects 108, when deformed, form electrical contacts with a respective first contact 110 and/or a respective second contact 106. In some embodiments, the electrical contacts are formed when the there is no gap or space between each complaint interconnect 108 and the respective first or second contact. In some embodiments, the electrical contacts are formed when the contact area between each respective compliant interconnect 108 and the respective first or second contact exceeds a threshold contact area (e.g., 80%-120% of a cross section dimension of the respective compliant interconnect 108, 80%-120% of an area of the respective first or second contact). In an example, the second contacts have a pitch of 300 µm, and each second contact has a width of 150 µm. A respective compliant interconnect 108 is deformed and forms an electrical contact with a respective second contact, when its contact area with the respective second contact covers at least 80% of the corresponding width of 150 µm. Alternatively, the compliant interconnect 108 is deformed and forms the electrical contact with the respective second contact, when its contact area with the respective second contact reaches at least 80% of a cross section of the compliant interconnect 108 itself.

In some embodiments, the electrical contacts are formed when the plurality of compliant interconnects 108 are compressed by the threshold amount (e.g., 40%-80% depending on a type of the compliant interconnect). In some embodiments, the electrical contacts are formed when a contact resistance between each compliant interconnect 108 and its respective first or second contact is less than a threshold resistance. In some embodiments, the electrical contacts are formed, when there is no gap and/or space between the respective plurality of first contacts and/or the respective plurality of second contacts after the plurality of compliant interconnects are deformed.

In some embodiments, the support structure 102 can be decoupled from the substrate 112 without damaging the support structure 102, electronic device 104 or substrate 112. In some embodiments, the support structure 102 and substrate 112 are permanently coupled. In some embodiments, the support structure 102 is coupled to the substrate 112 via an adhesive 120. In some embodiments, the support structure 102 is coupled to the substrate 112 using bonding, e.g., direct bonding, eutectic bonding, anodic bonding, glass frit bonding, adhesive bonding, and any other known and applicable methods of bonding.

In some embodiments, when the support structure 102 is coupled to the substrate, an enclosure 122 is formed to enclose the electronic device 104. In some embodiments, the enclosure is a vacuum, i.e., reaching a predetermined vacuum level (not necessarily in an absolute vacuum). In some embodiments, the enclosure 122 is not a vacuum. In some embodiments, air pressure within the enclosure is less than a predetermined pressure. In some embodiments, the enclosure 122 is in an ambient pressure. In some embodiments, the support structure 102 is grounded to provide an electromagnetic (EM) shielding. The EM shielding reduces the electromagnetic fields in the enclosure 122 by isolating the electronic device 104 from surroundings that may include noise and impact electrical performance of the electronic device 104. In some embodiments, the support structure 102 defines a recess wherein the electronic device 104 can be coupled. In some embodiments, the support structure 102 is further configured to align the plurality of second contacts 106 and the plurality of first contacts 110.

That said, when the support structure 102 mechanically couples the electronic device 104 to the substrate 112, the plurality of second contacts 106 of the electronic device 104 make contact with the plurality of first contacts 110 of the substrate 112 via the plurality of compliant interconnects 108. In some embodiments, the support structure 102 merely touches the third surface 104b of the electronic device 104 such that, when the support structure 102 is removed, the electronic device 104 is detached from the support structure 102. For example, when the support structure 102 is decoupled from substrate 112, the electronic device 104 remains mechanically coupling to the substrate 112.

In some embodiments, an additional electronic device is coupled in the recess of the support structure 102, e.g., adjacent to the electronic device 104. The electronic device 104 and the additional electronic device are electrically coupled to each other via the plurality of compliant interconnects 108 that are deformed to electrically couple with the plurality of first contacts 110 of the substrate 112 and/or the plurality of second contacts 106 of the electronic device 104. In some embodiments, the substrate 112 is coupled to another electronic device that is disposed outside the recess of the support structure 102. The other electronic device is electrically coupled to electronic device 104 in the recess via interconnects formed on the substrate 112. In some embodiments, substrate 112 includes a first integrated circuit formed on the substrate 112. The electronic device 104 coupled in the recess of the support structure 102 is electrically coupled to the first integrated circuit via the plurality of compliant interconnects 108 that are deformed to electrically couple with the plurality of first contacts 110 of substrate 112 and/or the plurality of second contacts 106 of electronic device 104.

Figure 2A:
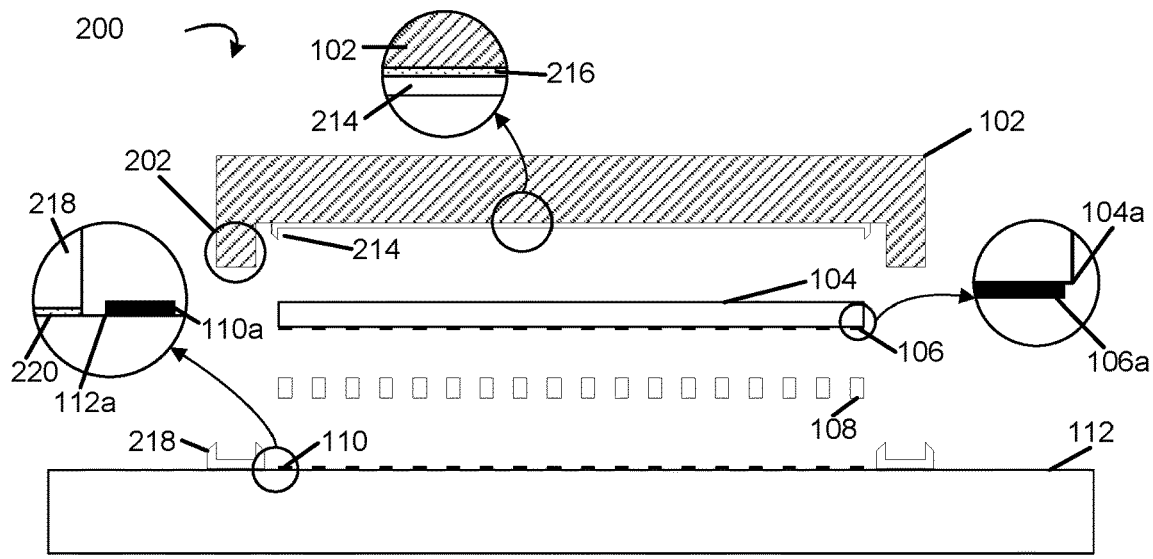
FIGS. 2A-2C illustrate a system and process of coupling an electronic device to a substrate via a support structure having fastener structures to form a representative flip chip assembly 200 in accordance with some embodiments.
Figure 2B:
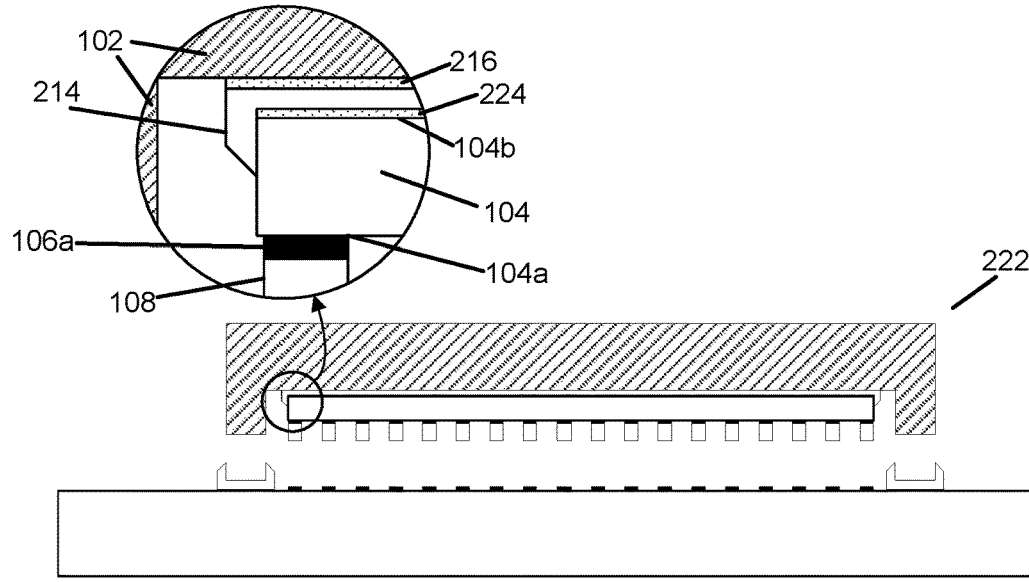
Figure 2C:
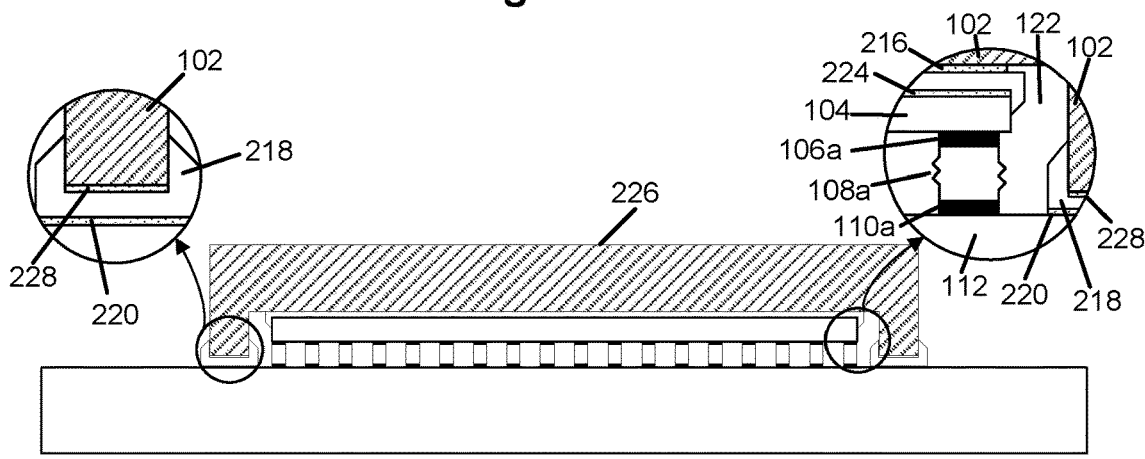

FIGS. 2A-2C illustrates another process of coupling an electronic device to a substrate via a support structure having fastener structures to form a representative flip chip assembly 200 in accordance with some embodiments. Specifically, FIG. 2A is an expanded view of the flip chip assembly 200, and FIGS. 2B and 2C show a first coupled state and a second coupled state of the flip chip assembly 200, respectively. The flip chip assembly 200 has a substrate 112 further including one or more first fastener structures 218 coupled to a surface of the substrate 112. The one or more first fastener structures 218 are configured to couple to a support structure 102. In some embodiments the one or more first fastener structures 218 are a cavity (e.g. a hole), frame, mount, surface of the substrate, clasp, clamp, clip, locking mechanism, latch, nuts, washers, fixtures, pins, hooks, anchors, screws, bolts, and other types of similar structures. The one or more first fastener structures 218 are configured to align and mate with one or more second fastener structures 202 of the support structure 102. In some embodiments, the one or more first fastener structures 218 are coupled (220) to the substrate 112 using an adhesive or via bonding. In some embodiments the one or more second fastener structures 202 are a cavity, frame, mount, clasp, clamp, clip, locking mechanism, latch, nuts, washers, fixtures, pins, hooks, anchors, screws, a portion of surface of the support structure, bolts, and other types of similar structures. When the one or more first fastener structures 218 and second fastener structures 202 are mated to each other, the first and second fastener structures 218 and 202 couple the support structure 102 onto the substrate 112.

In some embodiments, the support structure 102 further includes a third fastener structures 214 configured to couple with the third surface 104b of the electronic device 104. In some embodiments the third fastener structure 214 is a cavity, frame, mount, clasp, clamp, clip, locking mechanism, latch, nuts, washers, fixtures, pins, hooks, anchors, screws, a portion of surface of the support structure, bolts, and other types of similar structures. In some embodiments, the electronic device 104 further includes a fourth fastener structure (not shown, but could be third surface 104b) configured to be coupled with the support structure 102, e.g., coupled directly with the support structure 102 or coupled indirectly to the support structure 102 via the third fastener structure 214 of the support structure 102. In some embodiments, the fourth fastener structures (not shown) is the third surface of the electronic device, a cavity, frame, mount, clasp, clamp, clip, locking mechanism, latch, nuts, washers, fixtures, pins, hooks, anchors, screws, bolts, and other types of similar structures. As such, when the electronic device 104 and support structure 102 are mated to each other (e.g., via the third and/or fourth fastener structures), the electronic device 104 is physically coupled to the support structure 102.

FIG. 2B illustrates a first coupled state 222 in which the substrate 112 is coupled to the electronic device 104 via a third fastener structure 214 and a fourth fastener structure (not show, but could be the third surface 104b). In some embodiments, an adhesive 216 or a bonding process is applied to couple the support structure 102 and the third fastener structure 214. That said, in some embodiments, the support structure 102 is bonded to the third fastener structure 214 using at least one of direct bonding, surface activated bonding, plasma activated bonding, anodic bonding, eutectic bonding, glass frit bonding, adhesive bonding, thermal compression bonding, reactive bonding, and/or transient liquid phase diffusion bonding. Further, in some embodiments, the third fastener structure 214 coupled to the support structure 102 is further coupled to the third surface 104b of the electronic device 104 (i.e., an example of the fourth fastener structure) via a bonding process, use of an adhesive 224 or both. For example, the third fastener structure 214 coupled to the support structure 102 is bonded to the third surface 104b of the electronic device 104 using one of direct bonding, surface activated bonding, plasma activated bonding, anodic bonding, eutectic bonding, glass frit bonding, adhesive bonding, thermal compression bonding, reactive bonding, and/or transient liquid phase diffusion bonding. Examples of each of the adhesives 216 and 224 include, but are not limited to, epoxies, silicone, elastomers, sodium silicates, and/or thermal pastes. Specifically, in some situations, a thermal paste (e.g. adhesive) 224 can be used to bond the third surface 104b (i.e., an example of the fourth fastener structure) of the electronic device 104 to the third fastener structure 214 coupled to the support structure 102.

Shown in FIG. 2C is a second coupled state 226 in which the support structure 102 on which the electronic device 104 has been mounted is mechanically coupled to the substrate 112 via the one or more first fastener structure 218 and the one or more second fastener structure 202. When the support structure 102 and substrate 112 are mechanically coupled to each other, the plurality of compliant interconnects 108 is deformed and electrically couples the plurality of first contacts 110 of the substrate 112 and the plurality of second contacts 106 of the electronic device 104. As such, in the second coupled state 226, when the support structure 102 is mechanically coupled to the substrate 112 via the fastener structures 218 and 202, the electronic device 104 is electrically coupled to the substrate 112 via the plurality of compliant interconnects 108. Optionally, the plurality of compliant interconnects 108 is sequentially attached to the plurality of second contacts 106 of the electronic device 104 and pressed onto the plurality of first contacts 110 of the substrate 112. Optionally, the plurality of compliant interconnects 108 is sequentially attached to the first contacts 110 of the substrate 112 and pressed onto the second contacts 106 of the electronic device 104.

In some embodiments, the one or more first fastener structures 218 of the substrate 112 are configured to align and mate with the one or more second fastener structures 202 of the support structure 102. The first and second fastener structures 218 and 202, when mated, hold the support structure 102 onto the substrate 112. Further, in some implementations, the plurality of second contacts 106 and the plurality of first contacts 110 are configured to be self-aligned when the first and second fastener structures 218 and 202 are mated to each other. FIG. 2C further illustrates the bonding and/or adhesive used to couple the support structure 102, the electronic device 104, and the substrate 112. In some embodiments, bonding and/or adhesive method 220 couples the substrate 112 and the one or more first fastener structures 218. In some embodiments, the first fastener structures 218 are coupled (220) to the substrate 112 using an adhesive or via bonding, e.g., direct bonding, surface activated bonding, plasma activated bonding, anodic bonding, eutectic bonding, glass frit bonding, adhesive bonding, thermal compression bonding, reactive bonding, and/or transient liquid phase diffusion bonding. Further, in some embodiments, the one or more first fastener structures 218 and one or more second fastener structures 202 are coupled (228) using an adhesive or via bonding, e.g., direct bonding, surface activated bonding, plasma activated bonding, anodic bonding, eutectic bonding, glass frit bonding, adhesive bonding, thermal compression bonding, reactive bonding, and/or transient liquid phase diffusion bonding. Examples of the adhesives used to couple the support structure 102 to the substrate 112 include, but are not limited to, epoxies, silicone, elastomers, sodium silicates, and thermal pastes.

Figure 3A:
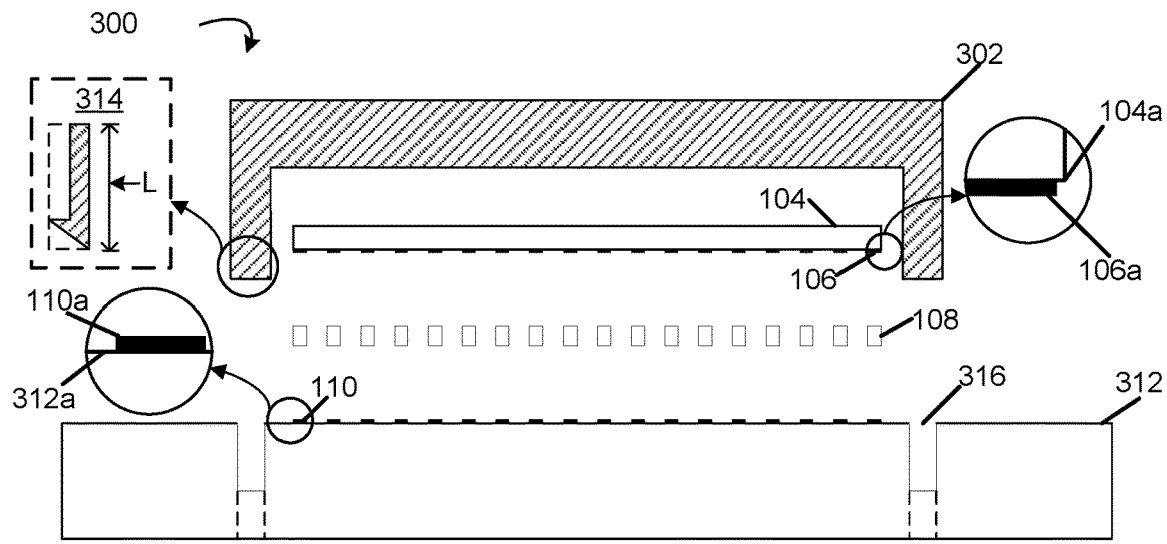
FIGS. 3A-3C illustrate another system and process of coupling an electronic device to a substrate via a support structure having fastener structures to form a representative flip chip assembly in accordance with some embodiments.
Figure 3B:
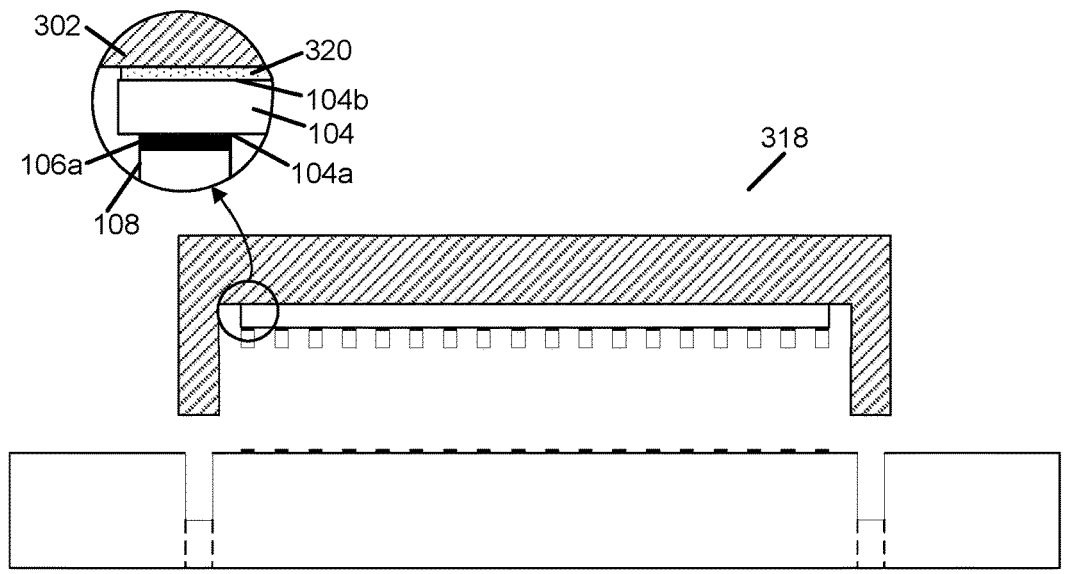
Figure 3C:
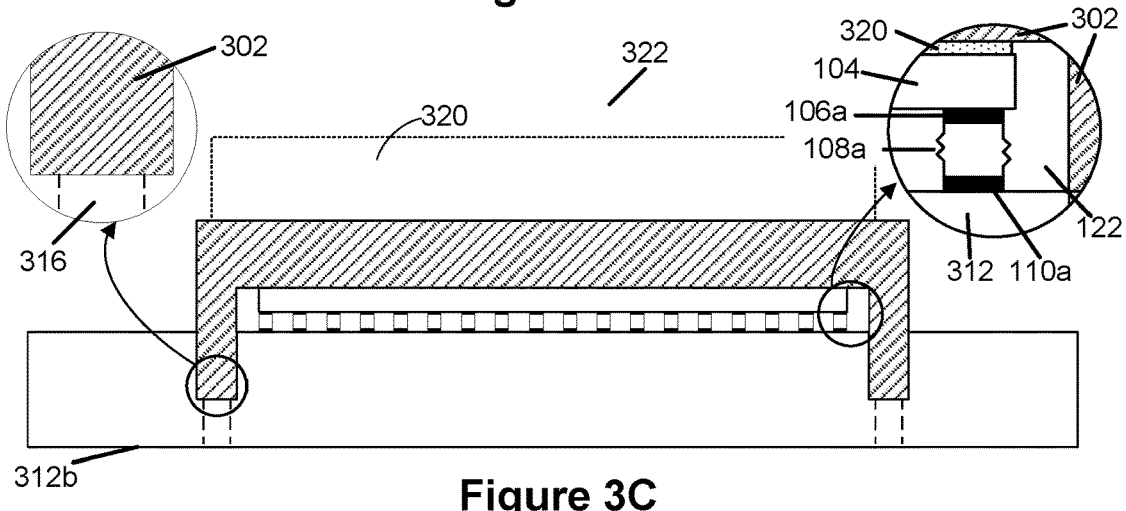

FIGS. 3A-3C illustrates another process of coupling an electronic device to a substrate via a support structure having fastener structures to form a representative flip chip assembly 300 in accordance with some embodiments. The flip chip assembly 300 is formed when a support structure 302 coupled to an electronic device 104 is mechanically coupled to a substrate 312 via one or more first fastener structures 316 of the substrate 312 and one or more second fastener structures 314 of the support structure 302. In an example (FIG. 3A), the first fastener structures 316 of the substrate 312 include cavities and/or holes configured to receive the second fastener structures 314 of the support structure 302. In some embodiments, each first fastener structure 316 is one of a frame, mount, surface of the substrate 312, clasp, clamp, clip, locking mechanism, latch, nuts, washers, fixtures, pins, hooks, anchors, screws, bolts, and other types of similar structures.

In this example, the one or more second fastener structures 314 is part of support structure 302, and can vary in shape and length. In an example, each second fastener structure 314 includes a locking feature (e.g., a barb in FIG. 3A) to be locked in the corresponding first fastener structure 316 of the substrate 312. In some embodiments, the second fastener structures 314 are defined by a predetermined length. In some embodiments, the one or more second fastener structures 314 extend beyond a threshold height corresponding to a sum of a thickness of the electronic device 104 and a height of the plurality of compliant interconnects 108 (including contact heights of the first contacts 110 and the second contacts 106). A recess depth of the support structure 302 is not greater than the threshold height such that when the support structure 302 is coupled to the substrate 312, the compliant interconnects 108 can be deformed and coupled to the first and second contacts tightly. In some embodiments, the one or more second fastener structures 314 includes an anchor-like structure as depicted in FIG. 3A. Further, in some implementations, each second fastener structure 314 is optionally one of a cavity, frame, mount, clasp, clamp, clip, locking mechanism, latch, nuts, washers, fixtures, pins, hooks, anchors, screws, a portion of surface of the support structure, bolts, and other types of similar structures.

FIGS. 3B and 3C show a first coupled state 318 and a second coupled state 322 of the flip chip assembly 300, respectively. In some embodiments, the one or more first fastener structures 316 are configured to align the plurality of second contacts 106 and the plurality of first contacts 110, such that when the support structure 302 is mechanically coupled to the substrate 312 via the fastener structures 314 and 316, the plurality of second contacts 106 of the electronic device 104 is aligned with the plurality of first contacts 110 of the substrate 112 and can be conveniently connected by the plurality of compliant interconnects 108. In some embodiments, the one or more first fastener structures 316 of the substrate 312 includes a via hole extending to a fourth surface 312b opposing the first surface 312a of the substrate 312. In some embodiments, each first fastener structure 316 is an exact fit of and is configure to be mated to a corresponding second fastener structure 314. In some embodiments, the one or more first fastener structures 316 are for guiding and/or aligning the one or more second fastener structures 314. In some embodiments, when the substrate 312 is penetrated and/or pierced by the one or more second fastener structures 314, the flip chip assembly 300 cannot be disassembled without damaging the first fastener structures 316 and/or the second fastener structures 314.

In some embodiments, the one or more second faster structures 314 of the support structure 302 are planar. In some embodiments, the predetermined length of the one or more second fastener structures 314 is less than the total thickness of the substrate 312. In some embodiments, the predetermined length of the one or more second fastener structures 314 is equal to or greater than the thickness of substrate 312 such that, when substrate 312 and support structure 302 are coupled via the second fastener structures 314, the second faster structures 314 are mated and/or flush with a fourth surface 312b of substrate 312 or extend beyond and couple to the fourth surface 312b of substrate 312. In some embodiments, the one or more second fastener structures 314 lock into place after piercing or penetrating the substrate 312 by a predetermined amount. In some embodiments, the one or more second fastener structures 314 snap in into position after piercing and/or penetrating the substrate 312 by the predetermined amount. In some embodiments, the one or more first fastener structure 316 and the one or more second fastener structures 314 are coupled together using an adhesive and/or via bonding.

In some embodiments, the support structure 302 includes a heat sink configured to absorb heat generated by the electronic device 304 and dissipate the generated heat to an ambient via a relatively large surface. Alternatively, the support structure 302 is a thermal spreader coupled to a heat sink 320. The support structure 302 is configured to absorb heat generated by the electronic device 304 and spread the generated heat to the heat sink 320.

Figure 4A:
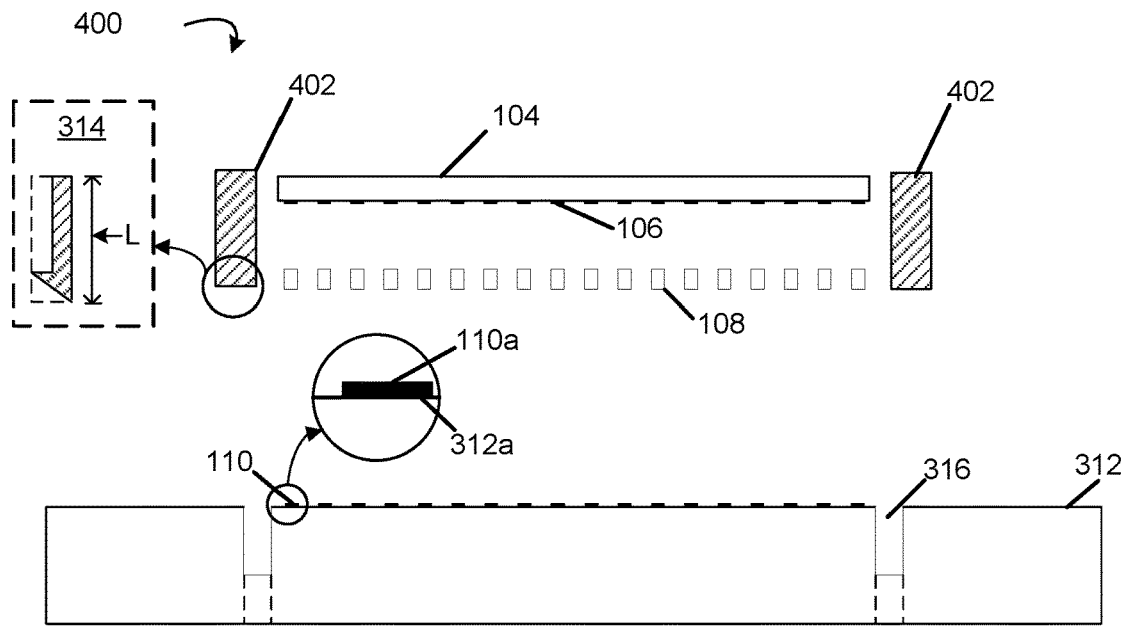
FIGS. 4A-4C illustrate a system and process of coupling an electronic device to a substrate via a support structure coupled to an edge of the electronic device to form a representative flip chip assembly in accordance with some embodiments.
Figure 4B:
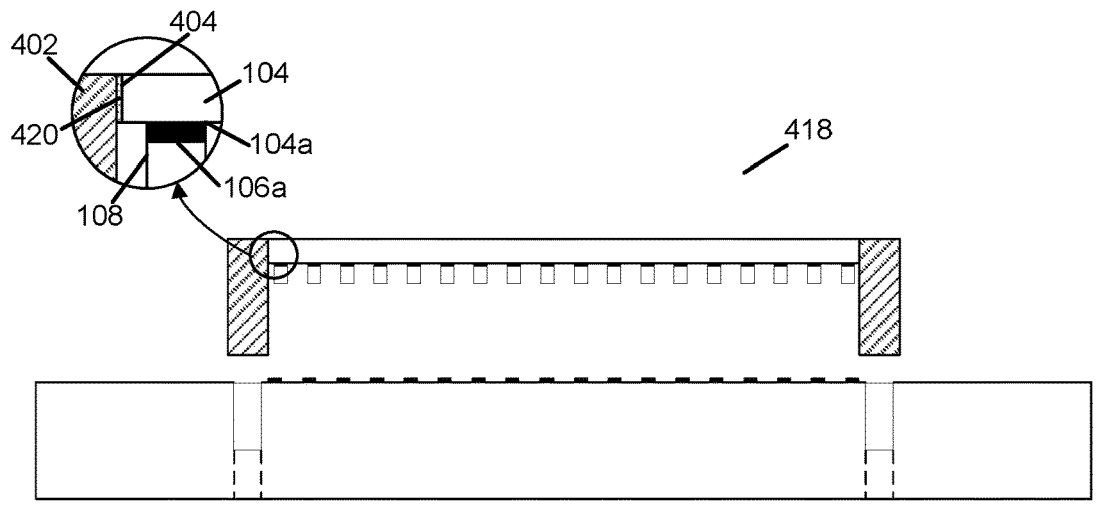
Figure 4C:
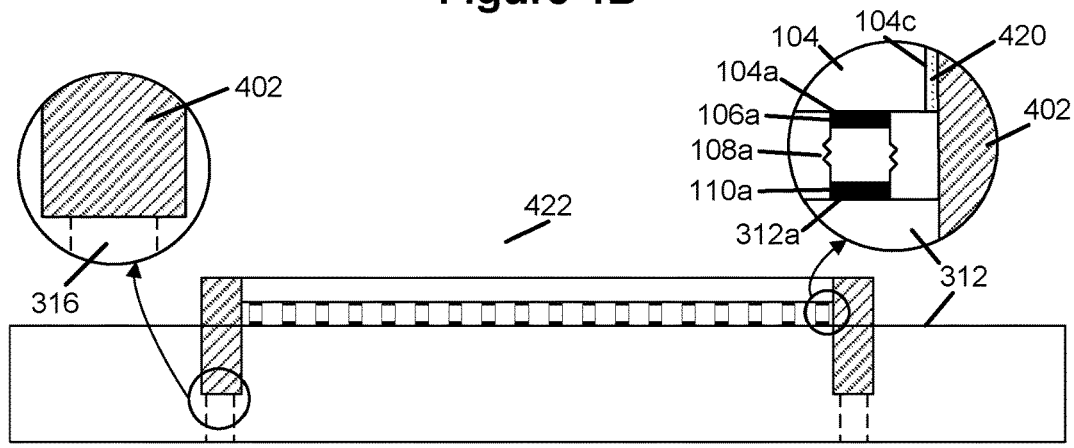

FIGS. 4A-4C illustrate another system and process of coupling an electronic device 104 to a substrate 312 via a support structure 402 coupled to an edge of the electronic device 104 to form a representative flip chip assembly 400 in accordance with some embodiments. The support structure 402 is configured to couple to at least a peripheral edge of the electronic device 104, and optionally does not include a portion over the third surface 104b of electronic device 104. In contrast, the support structures in the flip chip assemblies 100, 200 and 300 are configured to couple to a rear surface of the electronic device.

FIGS. 4B and 4C show a first coupled state 418 and a second coupled state 422 of the flip chip assembly 400, respectively. The support structure 402 is couples to the electronic device 104 via one or more edges 404 of the electronic device 104. In some embodiments, support structure 402 is coupled (420) to the one or more edges 404 using an adhesive or via bonding. In some embodiments, the plurality of compliant interconnects 108 and the plurality of second contacts 106 are placed at a predetermined distance from the support structure 402. The plurality of compliant interconnects 108 are deformed and electrically coupled to the plurality of first contacts 110 and/or the plurality of second contacts 106, when the support structure 402 mechanically couples the electronic device 104 to the substrate 412. For example, a first compliant interconnect 108a (i.e. deformed compliant interconnect 108a) is deformed to electrically couple a respective first contact 110a and a respective second contact 106a. In some embodiments, each of the plurality of compliant interconnects 108 are configured to be deformed and/or compressed by a predetermined amount, e.g., 40%-80% of their respective height, depending on the type of interconnect. In some embodiments, each of the plurality of compliant interconnects 108 is deformed such that reliable electrical contacts with the first and second contacts are formed.

Figure 5A:
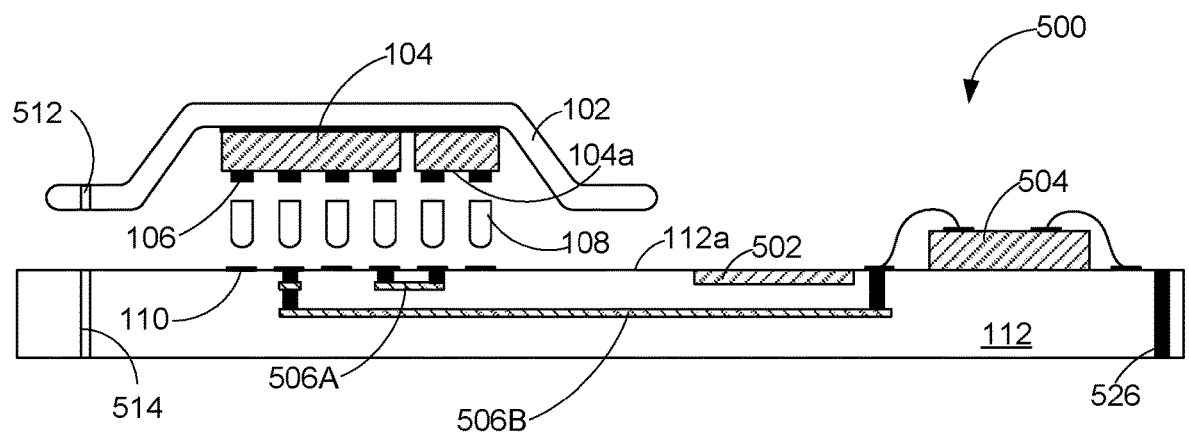
FIGS. 5A-5D illustrate a system and process of coupling one or more electronic devices to a substrate via a cover-like support structure to form a representative flip chip assembly in accordance with some embodiments.
Figure 5B:
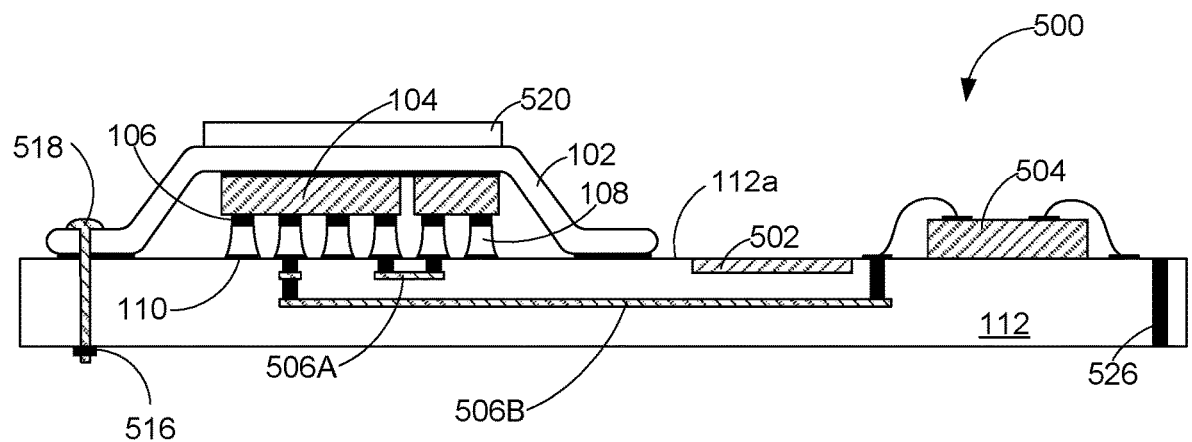

FIGS. 5A and 5B illustrates a system and process of coupling one or more electronic devices 104 to a substrate 112 via a cover-like support structure to form a representative flip chip assembly 500 in accordance with some embodiments. The substrate 112 includes a first surface 112a and a plurality of first contacts 110 formed on the first surface 112a. Each of the one or more electronic devices 104 includes a second surface 104a and a plurality of second contacts 106 formed on the second surface 104a. Each of the one or more electronic devices 104 has a footprint. The second surface 104a of each electronic device 104 faces the first surface 112a of the substrate 112. A plurality of compliant interconnects 108 are disposed between the first surface 112a of the substrate 112 and the second surfaces 104a of the one or more electronic devices 104. The plurality of compliant interconnects 108 are configured to electrically couple the plurality of first contacts 110 on the first surface 112a of the substrate 112 to the plurality of second contacts 106 on the second surfaces 104a of the electronic devices 104.

In various embodiments of this application, the one or more electronic devices 104 are mechanically coupled to the substrate 112 via the cover-like support structure 102. The support structure 102 extends beyond the footprints of the electronic devices 104. The support structure 102 is configured to provide a robust coupling mechanism to couple the one or more electronic devices 104 to the substrate 112. By these means, the one or more electronic devices 104 and the substrate 112 do not rely on an adhesive applied on the first surface 112a and/or the second surfaces 104a to form a sufficiently robust flip chip assembly 500, nor will performance of sensitive circuits formed on surfaces of the one or more electronic devices 104 or substrate 112 (e.g., radio frequency circuits) be compromised by the use of the adhesive.

Referring to FIG. 5B, when the one or more electronic devices 104 are mechanically coupled to the substrate 112 by the support structure 102, the plurality of compliant interconnects 108 are deformed to electrically couple with the plurality of first contacts 110 and/or the plurality of second contacts 106. When coupled to the first and second contacts 110 and 106, the plurality of compliant interconnects 108 provide a mechanical force to pull the one or more electronic devices 104 and the substrate 112 in addition to the robust coupling mechanism provided by the support structure 102.

Optionally, any one of the support structures 102, the one or more electronic devices 104 and the substrate 112 is made of silicon or glass. Optionally, the substrate 112 includes a printed circuit board having a plurality of metal layers. The printed circuit board may function as a heat sink or an electromagnetic shielding structure. In an example, the substrate 112 is a printed circuit board having a ground layer. The support structure 102 is entirely made of a metallic material, or made of other materials (e.g., silicon, glass, printed circuit board) having a metal shielding layer. The ground layer of the substrate 112 and the metallic material or the metal shielding layer of the support structure 102 are electrically coupled to a ground. Thus, when the flip chip assembly 500 is formed, the one or more electronic devices 104 are protected by ground shielding.

In some embodiments, the substrate 112 includes first electronic circuit 502 monolithically formed on the first surface 112a. In some embodiments, a chip 504 having second electronic circuit is mounted on the first surface 112a of the substrate 112 and electrically coupled to the substrate 112 in a hybrid manner. Optionally, the chip 504 is coupled to contacts on the first surface 112a of the substrate 112 via wire bonding. Optionally, the chip 504 is flip chip bonded to contacts on the first surface 112a of the substrate 112. In some embodiments, the substrate 112 includes a through-substrate via 526 configured to couple an interconnect and/or contact on the first surface 112a to another interconnect and/or contact on a distinct surface of the substrate 112 opposing the first surface 112a. In some embodiments, the substrate 112 includes one or more through-substrate vias 526.

In some embodiments, the substrate 112 includes a plurality of interconnects 506 formed in the one or more interconnect layers (e.g., the metal layers in the printed circuit board, interconnect layers on a glass or silicon substrate). For example, an interconnect 506A is configured to connect two of the plurality of first contacts 110. Optionally, the two connected first contacts 110 are coupled to two distinct electronic devices 104 (FIG. 5B). Optionally, the two connected first contacts 110 are coupled to the same electronic device 104 (not shown in FIGS. 5A and 5B). In another example, an interconnect 506B is configured to connect one of the plurality of first contacts 110 to the contact electrically coupled to the chip 504, thereby electrically coupling the electronic device 104 to the chip 504 located independently of the support device 102. Likewise, an interconnect 506 can be configured to connect one of the plurality of first contacts 110 to the first electronic circuit 502 formed on the substrate 112 or connect the first electronic circuit 502 to the contact associated with the chip 504.

In some embodiments, the support structure 102 is coupled to the electronic device 104 via an adhesive. In some embodiments not shown, the support structure 102 is coupled to the electronic device 104 via fastener structures that are configured to mate to each other. Similarly, in some embodiments, the support structure 102 and the substrate 112 are coupled to each other via an adhesive applied at a region where no electronic device 104 is disposed. Alternatively, in some embodiments, the support structure 102 and the substrate 112 are mechanically coupled to each other via fastener structures. Optionally, the fastener structures (e.g., holes 512 and 514 in FIG. 5A) are part of the support structure 102 and substrate 112. Optionally, the fastener structures (e.g., nut 516 and bolt 518 in FIG. 5) are external to the support structure 102 and substrate 112. In some embodiments, the support structure 102 and the substrate 112 are mechanically coupled to each other via both the additive and the fastener structures.

In some embodiments, the support structure 102 includes a heat sink, i.e., at least partially acts as the heat sink. In some embodiments, the support structure 102 is further coupled to a separate heat sink 520, and the heat sink 520 is optionally attached to a top surface of the support structure 102 that is opposite to a recess surface on which the electronic device 104 is mounted. It is noted that the support structure defines a recess and has a depth of the recess equal to or less than a sum of a thickness of the electronic device and a height of the plurality of compliant interconnects, such that when the support structure mechanically couples the electronic device to the substrate, the plurality of second contacts 106 of the electronic device 104 makes contact with the plurality of first contacts 110 of the substrate 112 via the plurality of compliant interconnects 108.

Figure 5C:
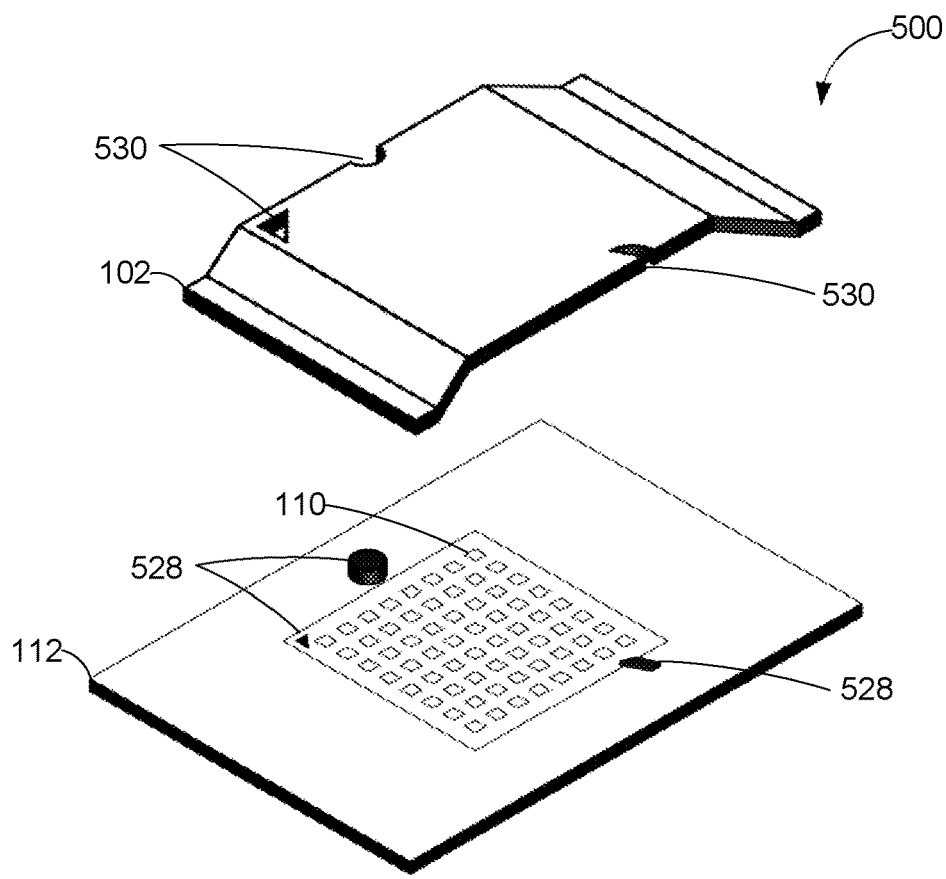
Figure 5D:
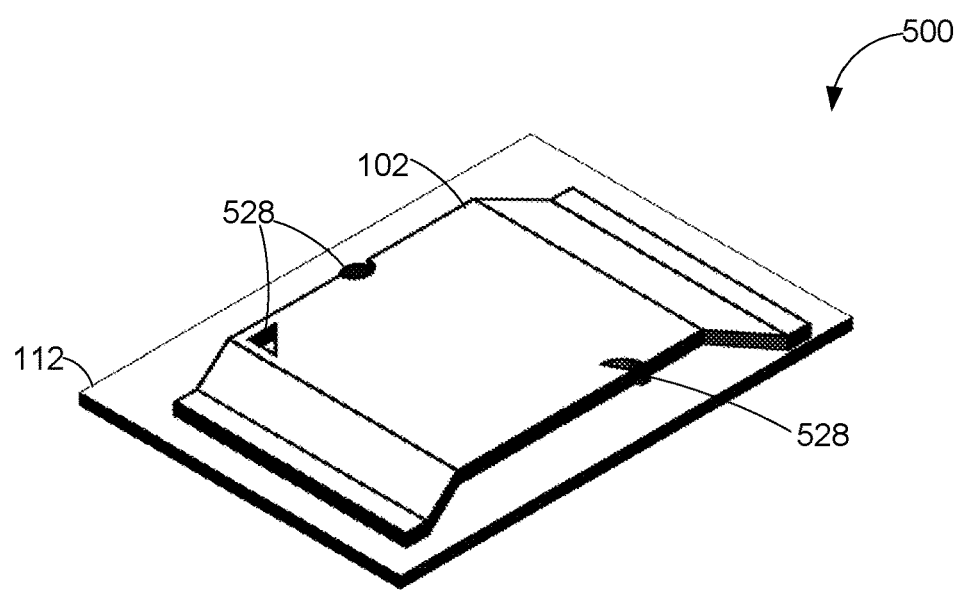
Figure 6B:
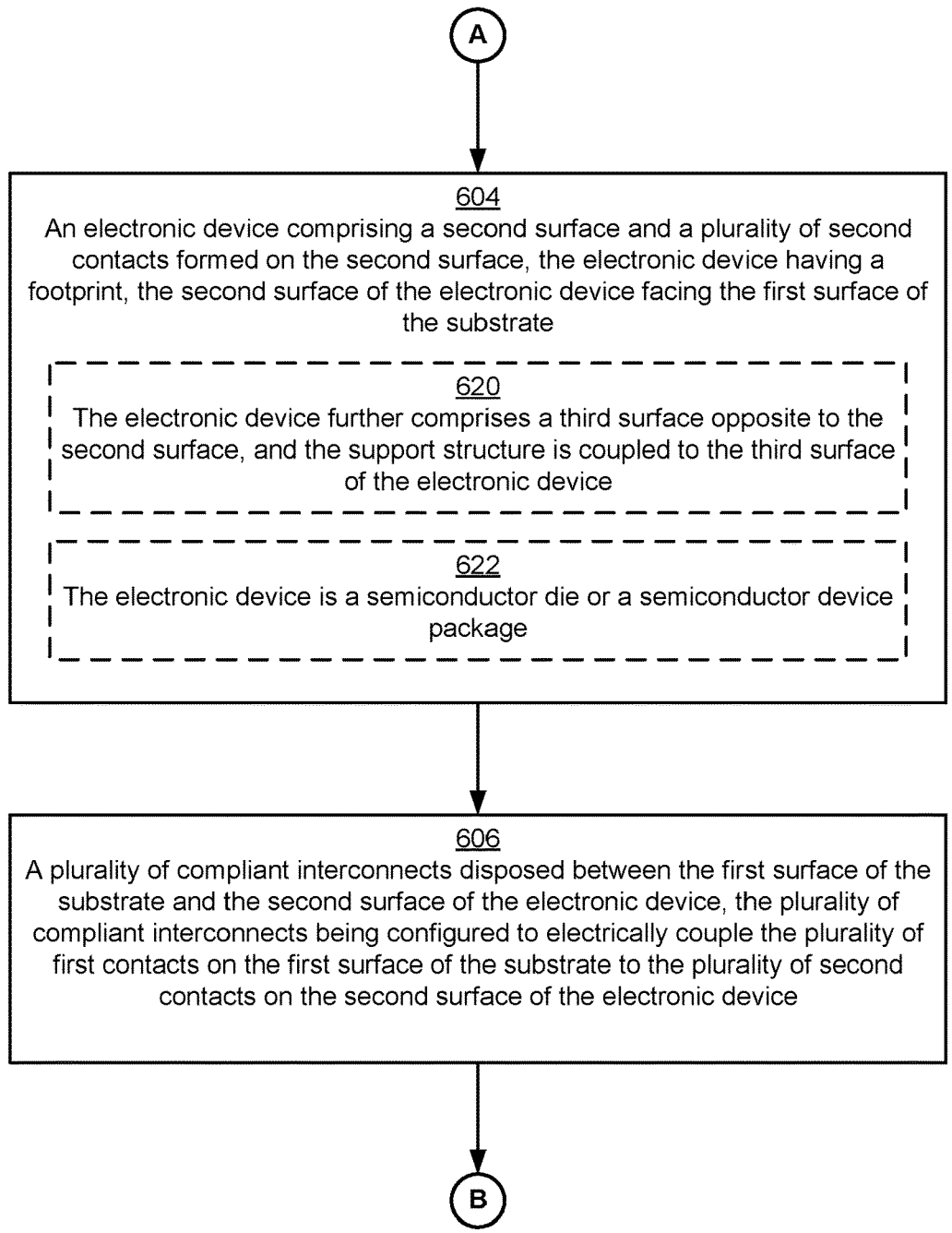
Figure 6C:
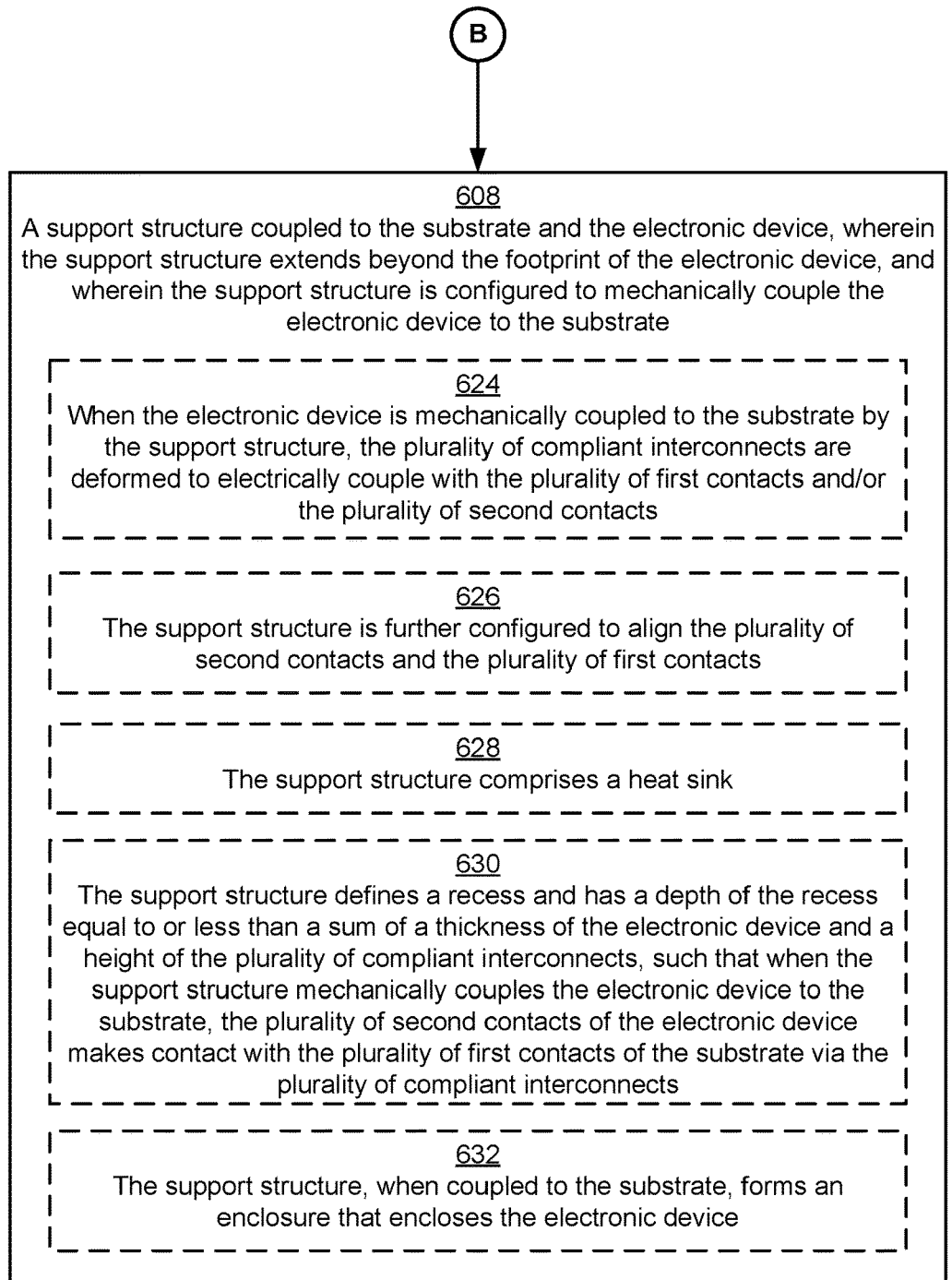

FIGS. 5C and 5D illustrates a top view of the system and process of coupling one or more electronic devices 104 to a substrate 112 via a cover-like support structure to form a representative flip chip assembly 500 in accordance with some embodiments. FIG. 5C shows an uncoupled state of support structure 102 and substrate 112. In some embodiments, substrate 112 includes one or more alignment indicators 528. In some embodiments, the alignment indicators 528 are markings, obstructions (e.g. pins, circuits, screws, etc.), fixtures, protrusions, and/or other components of substrate 112. In some embodiments, support structure 102 includes one or more affordances 530 for assisting and/or guiding alignment of support structure 102 and substrate 112. In some embodiments, the one or more affordances 530 include cavities, view holes, partitions, etc. FIG. 5D shows a coupled state of support structure 102 and substrate 112. In some embodiments the support structure 102 and substrate 112 are coupled together via the fastener structures 516 and 518. It should be noted the support structure 102 and substrate 112 can be coupled together via any method discussed above in FIGS. 1A-5B. In some embodiments, the plurality of second contacts 106 and the plurality of first contacts 110 are configured to self-align when the support structure 102 and the substrate 112 are couple together (e.g. via the fastener structures discussed above). Moreover, the one or more alignment indicators 528 are visible and/or identifiable via the one or more affordances 530 of support structure 102.

It should be understood that various structures depicted in FIGS. 1A-5D are merely exemplary and are not intended to indicate that the depicted structures are the only structures applicable in the flip chip assemblies. Additionally, it should be noted that details of the flip chip assembly described herein in any of FIGS. 1A-5D are also applicable in an analogous manner to the other flip chip assemblies described above with respect to any other figures in FIGS. 1A-5D. For brevity, these details are not repeated for all figures.

FIGS. 6A-6D are flow diagrams showing a method 600 of constructing a semiconductor system (e.g., flip chip assemblies 100, 200, 300, 400 and 500) in accordance with some embodiments. Operations of method 600 are performed by a manufacturer of the semiconductor system or by a company that assembles and implements the semiconductor system into various electronic products (e.g., RF products).

Method 600 includes providing (602) a substrate (e.g., substrates 112 and 312 in FIGS. 1A-5B) including a first surface and a plurality of first contacts formed on the first surface and providing (604) an electronic device (e.g., electronic device 104 in FIGS. 1A-5B) including a second surface and a plurality of second contacts formed on the second surface. The electronic device has a footprint, and the second surface of the electronic device faces the first surface of the substrate. Method 600 further includes providing (606) a plurality of compliant interconnects disposed between the first surface of the substrate and the second surface of the electronic device. The plurality of compliant interconnects is configured to electrically couple the plurality of first contacts on the first surface of the substrate to the plurality of second contacts on the second surface of the electronic device. Method 600 further includes providing (608) a support structure (e.g., structures 102, 302 and 402 in FIGS. 1A-5B) coupled to the substrate and the electronic device. The support structure extends beyond the footprint of the electronic device, and the support structure is configured to mechanically couple the electronic device to the substrate.

Turning to FIG. 6A, in some embodiments, the substrate includes (610) one or more first fastener structures that are configured to align and mate with one or more second fastener structures of the support structure, such that, when mated, the first and second fastener structures hold the support structure onto the substrate (see first fastener structures 218 and/or 316 and second fastener structures 202 and/or 314 in FIGS. 1A-5B). When the first and second fastener structures are mated to each other, the plurality of second contacts and the plurality of first contacts are configured to be self-aligned (612) (see FIGS. 5C and 5D). Further, in some embodiments, the support structure is detachable (614) from the substrate, e.g., without damaging the substrate or the electronic device. The substrate, the electronic device or both may be recycled to be used in another flip chip assembly. In some embodiments, the substrate includes (616) a printed circuit board (PCB). The PCB optionally includes one or more semiconductor dies or discrete components (e.g., the chip 504 in FIGS. 5A and 5B) that are distinct from the electronic device and mounted on a top surface of the PCB. In some embodiments, the PCB includes one or more layers of interconnects. In some embodiments, the first surface of the substrate (e.g., first surface 112a in FIG. 1) is (618) planar.

In some embodiments, the electronic device includes (622) a semiconductor die or a semiconductor device package. In some embodiments, the electronic device includes (620) a third surface opposite to the second surface of the electronic device, and the support structure is coupled to the third surface of the electronic device. In some embodiments, the electronic device includes one or more edges (e.g., edges 404 in FIGS. 4A-4C), and the one or more edges of the electronic device are coupled to the support structure. Stated another way, the support structure is coupled to the electronic device either via the third surface of the electronic device or via the one or more edges of the electronic device, and no adhesive is applied between the first surface of the substrate and the second surface of the electronic device, particularly in any region of the first and second surfaces having circuit.

In some embodiments, when the electronic device is mechanically coupled to the substrate by the support structure, the plurality of compliant interconnects is deformed to electrically couple to the plurality of first contacts and/or the plurality of second contacts, e.g., the compliant interconnect 108a is deformed and electrically coupled to the first contact 110a and the second contact 106a (FIGS. 1A-5B). In some embodiments, when the support structure couples the electronic device to the substrate, the plurality of compliant interconnects are physically coupled to the first and second contacts. The corresponding flip chip assembly is then thermally annealed to improve contact between the compliant interconnects 108 and the first and second contacts. Specially, the compliant interconnects may be slightly melted to form electrical contact with the first and second contacts. In some embodiments, the support structure is configured (626) to align the plurality of second contacts and the plurality of first contacts (e.g. FIGS. 1A-5B). That said, in some situations, when the support structure is disposed in position to couple the electronic device to the substrate, the plurality of second contacts is automatically aligned with the plurality of first contacts. In some embodiments, the support structure includes (628) a heat sink (FIGS. 1A-4C). In some embodiments, the support structure can include a heat sink while, in some embodiments, the support structure can be further coupled to a separate heat sink (e.g., heat sink 520 in FIG. 5B). In some embodiments, the support structure further defining (630) a recess having a depth, and the depth of the recess is equal to or less than a sum of a thickness of the electronic device and a height of the plurality of compliant interconnects, such that when the support structure mechanically couples the electronic device to the substrate, the plurality of second contacts of the electronic device makes contact with the plurality of first contacts of the substrate via the plurality of compliant interconnects (e.g. FIGS. 1C, 2C, 3C, 4C and 5C). In some embodiments, method 600 includes forming (632) an enclosure that encloses the electronic device when the support structure is coupled to the substrate (e.g. 1C, 2C, 3C, 4C, and 5B). In some embodiments, the enclosure is formed by vacuum packaging, i.e., air is partially removed from an interior space of the enclosure before the enclosure is formed. In some embodiments, the pressure within the enclosure is less than a predetermined threshold pressure level. In some embodiments, the enclosure is not in an ambient pressure.

In FIG. 6D, method 600 further includes configuring (634) the support structure such that it is detachable from the electronic device (e.g. FIGS. 1A-5B). In some embodiments, method 600 includes coupling (636) the support structure to the substrate via an adhesive (e.g. FIGS. 1A-5B). In some embodiments, the support structure further includes (638) a third fastener structure (e.g. third fastener structure 214 in FIGS. 2A-2C) that is configured to couple to a fourth fastener structure of the electronic device, and when mated, the third and fourth fastener structures couple the electronic device onto the support structure. In some embodiments, method 600 includes coupling (640) the support structure to the electronic device via an adhesive (e.g. FIGS. 1A-5B). In some embodiments, method 600 includes coupling (642) the support structure to the substrate via one of direct bonding, eutectic bonding, anodic bonding and glass soldering (e.g. FIGS. 1A-5B). In some embodiments, any one of the support structure, electronic device and substrate is made of (644) silicon or glass. In some embodiments, method 600 further includes providing (646) a material of the support structure that is distinct from a material of the substrate.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will also be understood that, although the terms "first," "second," etc. may be used herein to describe various elements, these elements should not be limited by these terms. These terms are only used to distinguish one element from another. For example, a first region could be termed a second region, and, similarly, a second region could be termed a first region, without changing the meaning of the description, so long as all occurrences of the "first region" are renamed consistently and all occurrences of the "second region" are renamed consistently. The first region and the second region are both regions, but they are not the same region.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A semiconductor system, comprising:
    a substrate comprising a first surface and a plurality of first contacts formed on the first surface;
    an electronic device comprising a second surface and a plurality of second contacts formed on the second surface, the electronic device having a footprint, the second surface of the electronic device facing the first surface of the substrate;
    one or more first fastener structures coupled to the first surface of the substrate;
    a plurality of compliant interconnects individually attached to one or more of the plurality of first contacts on the first surface of the substrate and the plurality of second contacts on the second surface of the electronic device, wherein:
        each compliant interconnect is attached without being supported by any spacer disposed between the first and second surfaces, has a height that is compressible by an amount up to a predetermined percentage of the height that is not limited by any spacer and is compressed by at least a threshold amount; and
        the plurality of compliant interconnects electrically couple the plurality of first contacts on the first surface of the substrate to the plurality of second contacts on the second surface of the electronic device based on compression of the compliant interconnects by at least the threshold amount; and
    a support structure having a recess and one or more second fastener structures coupled to the one or more first fastener structures so that the substrate and the electronic device are coupled, wherein:
        the support structure extends beyond the footprint of the electronic device, and
        a depth of the recess is equal to or less than a sum of a thickness of the electronic device and a height of the plurality of compliant interconnects, such that when the one or more first fastener structures are mechanically coupled to the one or more second fastener structures, the plurality of compliant interconnects are compressed by an amount equal to or greater than the threshold amount so that the plurality of second contacts of the electronic device are electrically coupled with the plurality of first contacts of the substrate via the plurality of compliant interconnects.

2. The semiconductor system of claim 1, wherein the plurality of compliant interconnects comprise at least one elastomer pin.

3. The semiconductor system of claim 1, wherein the electronic device further comprises a third surface opposite to the second surface, and the support structure is coupled to the third surface of the electronic device.

4. The semiconductor system of claim 1, wherein the support structure is further coupled to a heat sink, and the heat sink is attached to a top surface of the support structure that is opposite to a recess surface on which the electronic device is mounted.

5. The semiconductor system of claim 1, wherein the threshold amount of compression is at least 40%.

6. The semiconductor system of claim 1, wherein the support structure forms an enclosure that encloses the electronic device.

7. The semiconductor system of claim 1, wherein the support structure is detachable from the electronic device.

8. The semiconductor system of claim 1, wherein the plurality of second contacts and the plurality of first contacts self-align automatically when the first and second fastener structures are mated to each other.

9. The semiconductor system of claim 1, wherein the support structure is detachable from the substrate.

10. The semiconductor system of claim 1, wherein the support structure comprises a third fastener structure configured to couple to a fourth fastener structure of the electronic device, and the third and fourth fastener structures couple the electronic device onto the support structure.

11. The semiconductor system of claim 1, wherein the threshold amount of compression is 40%-80%.

12. The semiconductor system of claim 1, wherein any one of the support structure, the electronic device and the substrate is made of silicon or glass.

13. The semiconductor system of claim 12, wherein a material of the support structure is distinct from a material of the substrate.

14. The semiconductor system of claim 1, wherein compression of the plurality of compliant interconnects to electrically couple the plurality of first contacts on the first surface of the substrate to the plurality of second contacts on the second surface of the electronic device irreversibly transitions the plurality of compliant interconnects from a non-deformed state to a deformed state.

15. The semiconductor system of claim 1, wherein the electronic device includes a first electronic device, further comprising:
- a second electronic device comprising a fourth surface and a third contact formed on the fourth surface, wherein the support structure mechanically couples both the first and second electronic devices to the substrate, and the fourth surface of the second electronic device faces the first surface of the substrate;
- a second compliant interconnect attached to one of the first contacts on the substrate and the third contact on the fourth surface of the second electronic device;
- wherein the third contact on the fourth surface of the second electronic device is electrically coupled to a subset of the second contacts on the second surface of the first electronic device via at least a subset of the plurality of compliant interconnects and the second compliant interconnect.

16. The semiconductor system of claim 1, wherein the electronic device includes a first electronic device, further comprising:
- a third electronic device comprising a fourth contact, wherein the third electronic device is disposed on the substrate and physically separate from the support structure, and the fourth contact is electrically coupled to a first one of the first contacts on the first surface of the substrate; and
- wherein the fourth contact of the third electronic device is electrically coupled to a subset of the second contacts on the second surface of the first electronic device via at least a subset of the compliant interconnects, the first one of the first contacts, a second one of the first contacts contacting the subset of the compliant interconnects, and an interconnect that is formed on the substrate and couples the first and second ones of the first contacts.

* * * * *